US005563504A

United States Patent [19]

Gilbert et al.

[11] Patent Number: 5,563,504

[45] Date of Patent: Oct. 8, 1996

[54] SWITCHING BANDGAP VOLTAGE REFERENCE

[75] Inventors: Barrie Gilbert; Shao-Feng Shu, both of Portland, Oreg.

[73] Assignee: Analog Devices, Inc., Norwood, Mass.

[21] Appl. No.: 239,718

[22] Filed: May 9, 1994

[51] Int. Cl.[6] .......... H03K 3/01

[52] U.S. Cl. .......... 323/316; 323/314; 323/313; 327/539

[58] Field of Search .......... 323/313, 314, 323/315, 316, 317; 327/554, 539

[56] References Cited

U.S. PATENT DOCUMENTS

| | | | |
|---|---|---|---|
| 4,375,595 | 3/1983 | Ulmer et al. | 323/314 |
| 4,714,872 | 12/1987 | Traa | 323/314 |
| 5,166,630 | 11/1992 | Lee | 327/554 |
| 5,168,179 | 12/1992 | Negahban-Hagh | 327/554 |
| 5,352,972 | 10/1994 | Pernici et al. | 323/313 |

*Primary Examiner*—Peter S. Wong
*Assistant Examiner*—Shawn Riley
*Attorney, Agent, or Firm*—Marger, Johnson McCollom & Stolowitz, P.C.

[57] ABSTRACT

A switched capacitor (SC) network is used in conjunction with a single PN junction to form a switching bandgap reference voltage circuit. The circuit includes an amplifier having an inverting input, a noninverting input, and an output; a first capacitor having a first capacitance ($C_1$) coupled between the amplifier inverting input and a first common voltage source; a second capacitor having a second capacitance ($C_2$) coupled between the amplifier inverting input and the amplifier output; a transistor having a base, a collector, and an emitter, the base and collector being coupled to the first common voltage source, and the emitter being coupled to the amplifier noninverting input. Two current sources are coupled to the transistor to bias the transistor to a one level during a precharge mode and a second, higher level during a reference voltage mode. A switch is connected in parallel with the second capacitor. The switch is opened during the precharge mode and closed during the reference voltage mode wherein a bandgap reference voltage ($V_o$) is produced at the amplifier output during the reference voltage mode equal to: $V_0=V_{BE2}+(C_2/C_1)\times(V_{BE2}-V_{BE1})$.

10 Claims, 2 Drawing Sheets

SWITCHING BANDGAP VOLTAGE REFERENCE

BACKGROUND OF THE INVENTION

This invention relates generally to bandgap reference circuits, and more particularly, to switch capacitor bandgap reference circuits. A stable reference voltage is a requirement in almost all integrated circuits (IC). The typical requirement is that the reference voltage be stable as a function of temperature. This requires that the reference voltage circuit have a low temperature coefficient. A typical application for a low temperature coefficient reference voltage is as a reference voltage for a voltage regulator.

The most common reference voltage is the so-called "bandgap" reference voltage. One popular embodiment of a bandgap reference circuit is shown in FIG. 1. The circuit shown in FIG. 1 is known as the Brokaw bandgap cell, named after the inventor. The bandgap circuit of FIG. 1 includes two transistors Q1 and Q2 whose sizes and/or bias currents are properly ratioed so as to produce a corresponding base to emitter junction voltage. The circuit produces a voltage across resistor R1 equal to the difference between the base to emitter voltages of the transistors Q1 and Q2, i.e., $V_{BE2}-V_{BE1}$. It can be shown that this voltage is proportional to absolute temperature (PTAT). If the circuit resistors have very low temperature coefficients, the currents flowing through the resistors R1 and R2 are also PTAT. The current through resistors R1 and R2 produce a voltage $V_R$ that is also PTAT. The voltage $V_{BE1}$ across the base to emitter junction of transistor Q1 can be shown to be complementary to the absolute temperature (CTAT). By properly choosing the device sizes, the bias currents, and the resistor values, the reference voltage $V_o$ can be made approximately stable with temperature due to the two countervailing voltages. A more detailed discussion of this circuit can be found in A. Paul Brokaw, "A Simple Three Terminal Bandgap Reference," *IEEE J. Solid-State Circuits,* Vol. SC9, pp. 288–393, Dec. 1974.

The Brokaw bandgap reference circuit uses two transistors to generate a voltage that is proportional to absolute temperature. The use of two transistors, however, introduces a major source of error in the accuracy of the reference voltage. This error is due to the mismatch between the two transistors. To compensate for this mismatch it is often necessary to modify the resistive elements of the bandgap reference circuit by "trimming" the resistors to produce the desired reference voltage. Although trimming can be successfully performed, it increases the cost of manufacturing the IC.

A single transistor bandgap reference that does not suffer from the transistor mismatch problem is shown in FIG. 2. The single transistor bandgap reference circuit of FIG. 2 is described in U.S. Pat. No. 5,059,820 issued to Alan L. Westwick. The bandgap reference of FIG. 2 uses two switches to time division multiplex two current sources (I1 and I2) to a single bipolar transistor to achieve an output voltage reference that is, to a first order, independent of temperature. The circuit operates in one of two repeating modes, a "precharge" mode and "valid output reference" mode. During the precharge mode, clocks 1 (Φ1) and 3 (Φ3) are at a logic high and clock 2 (Φ2) is a logic low. Thus, during the precharge mode, switches S2, S3, and S5 are closed and switches S1 and S4 are open. In contrast, during the valid output reference mode, clock 2 (Φ2) is at a logic high and clocks 1 (Φ1) and 3 (Φ3) are at a logic low.

Accordingly, during the output reference mode switches S1 and S4 are closed and the others are open.

During the precharge mode, the current produced by current source I1 is coupled to the transistor Q3 which develops a voltage $V_{BE1}$ across the base emitter voltage. Capacitors C1 and C2 precharged during this time and the output voltage VOUT goes to zero. During the valid output reference mode the current produced by current source I2 is supplied to the transistor Q3 and a base-to-emitter voltage $V_{BE2}$ is produced. A PTAT voltage $\Delta V_{BE}$ is developed during the output reference mode and the output of the differential amplifier A1 assumes a value which is the sum of the scaled $\Delta V_{BE}$ and a scaled $V_{BE1}$. The output reference voltage VOUT is therefore given by the equation:

$$VOUT=(C\times V_{BE}+K\times C\times\Delta V_{BE})/A * C$$

where K is capacitive ratio of capacitors C1 and C2; A is the capacitive ratio of C3 and C2, and; C is the capacitive value of C2.

Although the bandgap reference circuit of FIG. 2 eliminates the transistor mismatch problem of the Brokaw reference circuit, its suffers from its own inaccuracies due to the switch impedances as well as the variations in the capacitors. In addition, the bandgap reference circuit of FIG. 2 requires a three-phase clock which adds complexity to the circuit. Accordingly, what is desired is a simplified switch capacitor bandgap reference circuit.

SUMMARY OF THE INVENTION

It is therefore, an object of the invention to produce a bandgap reference voltage using only a single PN junction which minimizes the number of components necessary to implement the bandgap reference voltage circuit.

A further object of the invention is to minimize the complexity of the control signals needed to control the bandgap reference voltage circuit.

A simplified switch capacitor (SC) bandgap reference voltage circuit according to the invention is provided. The bandgap reference voltage circuit according to the invention includes a single PN junction implemented, in the preferred embodiment, by a PNP transistor. The transistor has two current sources coupled thereto for biasing the transistor to a first bias point during a precharge mode and to a second bias point during a reference voltage mode. The two current sources are coupled to the emitter of the transistor. A switch S2 is interposed between the second current source and the transistor emitter. The switch S2 is opened during the precharge mode so that the first current source provides all of the bias current to the transistor during the precharge mode. During the reference voltage mode, the switch S2 is closed and the sum of the currents produced from the first and second current sources are supplied to the transistor. The different levels of bias current supplied to the transistor during the precharge mode and the reference voltage mode produce different emitter-to-base voltages that are impressed upon a switched capacitor network by an operational amplifier.

The bandgap reference circuit also includes a conventional operational amplifier having a non-inverting input, an inverting input, and an output. The non-inverting input is connected to the emitter of the transistor. The first capacitor is coupled between the inverting input of the amplifier and the base of the transistor, which is further coupled to ground. A second capacitor is coupled between the non-inverting input and the output of the amplifier. An additional switch S1 is connected in parallel with the second capacitor. Thus, when switch S1 is closed, the amplifier operates in an unity-gain configuration.

The switching bandgap reference circuit according to the invention operates as follows. During the precharge mode, switch S1 is on and switch S2 is off. Since op-amp is operating in a unity-gain configuration, the voltage across the first capacitor is equal to the emitter-to-base voltage of the transistor ($-V_{BE1}$). Next, the circuit is placed in the reference voltage mode by turning switch S1 off and turning switch S2 on. The transistor now conducts the combined currents of first and second current sources whereby a base-to-emitter voltage ($V_{BE2}$) is produced thereacross. This forces the voltage across the first capacitor to be equal to $-V_{BE2}$. During the switching time, the charge at the inverting input of the amplifier is conserved. The resulting output voltage $V_o$ during the reference voltage mode is given by the following equation:

$$V_o = V_{BE2} + (C_2/C_1) \times (V_{BE2} - V_{BE1})$$

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
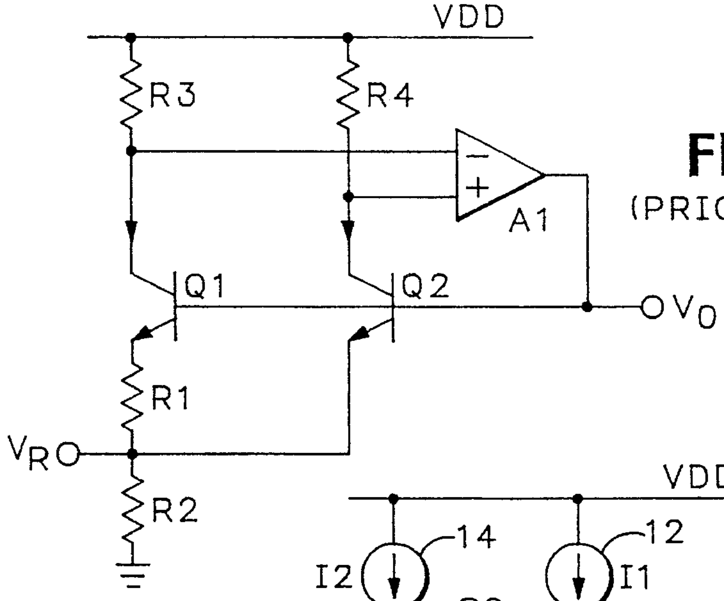
FIG.1 (PRIOR ART)
FIG. 1 is a prior art 2-transistor band-gap reference cell known as the Brokaw band-gap cell.
Figure 3:
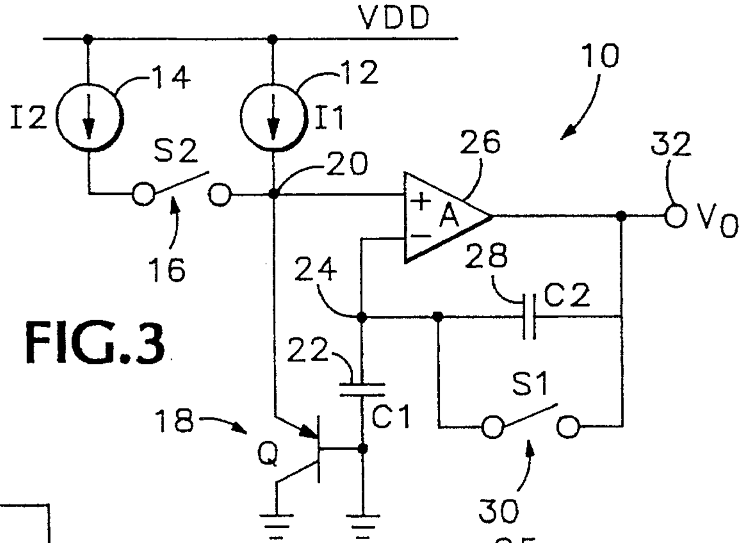
FIG. 3 is a single PN junction band-gap reference circuit according to the invention.
Figure 2:
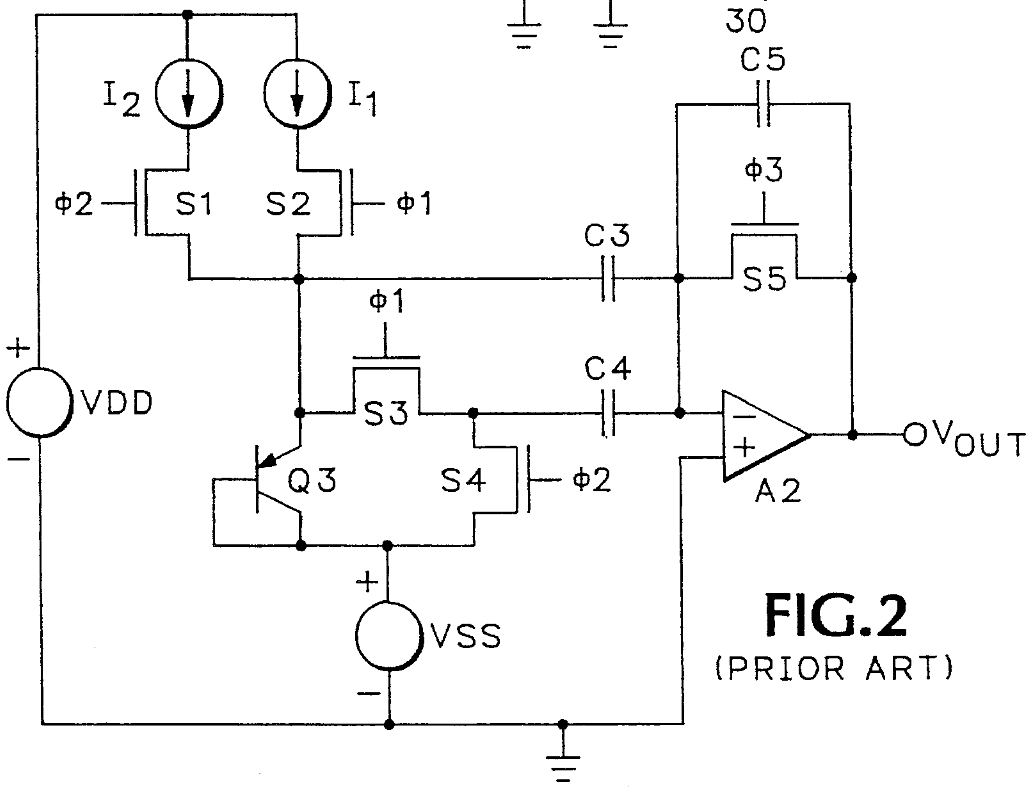
FIG.2 (PRIOR ART)
FIG. 2 is a prior art single transistor band-gap reference circuit.

Referring now to FIG. 3, a switching band-gap reference voltage circuit according to the invention is shown generally at 10. The circuit 10 includes a first current source 12 for supplying a first bias current I1. The circuit 10 further includes a second current source 14 that supplies a second bias current I2. The first and second current sources 12 and 14 are coupled to an emitter of a PNP transistor 18. A switch S2 shown generally at 16 is interposed between the second current source 14 and the emitter of transistor 18.

The two current sources 12 and 14, in cooperation with switch S2, supply two levels of bias current to the transistor 18. During a first mode, hereinafter the precharge mode, switch S2 is open as shown in FIG. 3. Thus, during the precharge mode, only the current I1 supplied from the first current source 12 is supplied to transistor 18. In a second mode, hereinafter the reference voltage mode, switch S2 is closed and, therefore, the combined currents I1 and I2 are supplied to the transistor 18. Because the current supplied to transistor 18 is greater during the reference voltage mode than during the precharge mode, the base-to-emitter voltage generated by the transistor during the precharge mode $V_{BE1}$ will be less than the base-to-emitter voltage produced by the transistor 18 during the reference voltage mode $V_{BE2}$.

Although a PNP transistor is shown in FIG. 3, the transistor is used simply as a PN junction. Thus, a appropriately configured NPN transistor or even a diode could be used in place of the PNP transistor without departing from the scope of the invention.

The band-gap circuit 10 further includes an operational amplifier 26. The opamp includes a noninverting input, an inverting input, and an output, as is conventional. The noninverting input of the opamp 26 is connected to a node 20 that is further connected to the emitter of transistor 18. The inverting input of the opamp 26 is coupled to the base of transistor 18 through a first capacitor 22 having a capacitance value C1. The base of the transistor is also coupled to ground. A second capacitor 28 having a capacitance C2 is coupled between the inverting input and the output of opamp 26. A first switch S1, shown generally at 30, is connected in parallel with the second capacitor 28. Thus, when switch S1 is closed, the output of the opamp 26 is connected to the inverting input of the opamp placing the opamp in a unity gain configuration. Both of the switches S1 and S2 are shown diagrammatically because a variety of switch implementations are possible. For example, the switches can be mechanical switches or electromechanical switches, or, as in the preferred embodiment, an electrical switch such as a field-effect-transistor (FET) or a bipolar-junction-transistor (BJT).

The circuit 10 operates as follows. During the precharge mode, as described above, switch S2 is open and, thus, bias current I1 is conducted by transistor 18. (This description assumes an ideal opamp 26 having zero leakage current.) During the precharge mode, switch S1 is closed placing the opamp 26 in the unity gain configuration. The transistor 18 will produce a base-to-emitter voltage equal to $V_{BE1}$. This voltage, $V_{BE1}$, will be impressed across capacitor 22 because the opamp 26 will charge capacitor C1 so as to equalize the voltages seen on the inverting and noninverting inputs thereof.

After capacitor 22 is fully charged to a base-to-emitter voltage $V_{BE1}$, the reference voltage mode is entered by opening switch S1 and closing switch S2. Opening switch S1 interposes capacitor 28 between the capacitor 22 and the opamp output. Closing switch S2 increases the bias current to transistor 18 which, thus, generates a concomitant base-to-emitter voltage $V_{BE2}$. During this switching time, however, the total charge at node 24 is conserved under the conservation of charge principle. Using the conservation of charge principle, the output reference voltage $V_o$ can be shown to be given by the following equation:

$$V_o = V_{BE2} + (C_2/C_1) \times (V_{BE2} - V_{BE1})$$

The reference voltage $V_o$ is, thus, the sum of a complementary-to-absolute voltage (CTAT), i.e., $V_{BE2}$, plus a proportional-to-absolute temperature voltage (PTAT), i.e., $V_{BE2} - V_{BE1}$. Therefore, the desired bandgap reference voltage is thus obtained.

Figure 4:
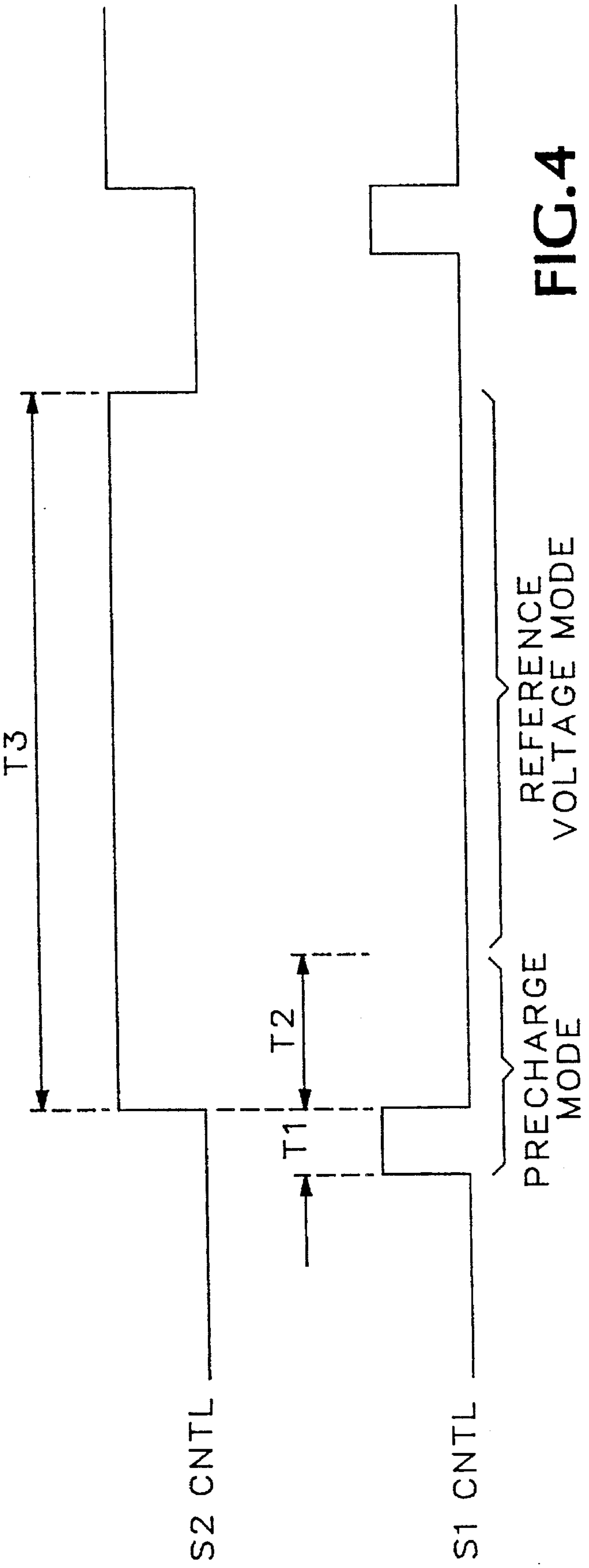
FIG. 4 is a timing diagram of the switching waveforms used to control the switching band-gap reference circuit of FIG. 3.

If, as in the preferred embodiment, electronic switches are used, two control signals can be used to switch the two switches S1 and S2 between the precharge mode and the reference voltage mode. The two control signals are shown in FIG. 4. The signal S1 CNTL is coupled to a control terminal of an electronic switch S1, e.g. the base. The signal S2 CNTL is coupled to the control terminal of switch S2. A circuit capable of producing the two control signals shown in FIG. 4 is well known in the art of analog circuit design and is, therefore, not discussed in detailed.

The control signals operate in one of two states: a logic low and a logic high. When the control signals are in the logic low state the corresponding switches operates as open circuits. When the control signals are in the logic high state the corresponding switches operate as closed circuits. The two modes of the circuit, i.e., the precharge mode and the reference voltage mode, and the corresponding control signal states are shown by brackets in FIG. 4. The limit imposed on the length of the reference voltage mode is determined by the amount of leakage current. The precharge mode is repeated as often as necessary to maintain an adequate charge on C2.

At the start of the precharge mode control signal S1 CNTL is in a logic high state, thus placing the op amp 26 in a unity gain mode, and control signal S2 CNTL is at a logic low state. Control signal S1 CNTL remains high for a time T1, which is approximately 50 nSec in the preferred embodiment. After time T1, the control signal S1 CNTL is set to a logic low and the control signal S2 CNTL is set to a logic high. This closes switch S2 and thus increases the bias current to the transistor 18. Following this transition a settling time T2 elapses during which time the reference voltage $V_o$ settles to the desired bandgap reference voltage level of approximately 1.24 V. The bandgap reference voltage remains at this valid voltage level for approximately 65 uSec while control signal S2 CNTL remains in a logic high state. The length of the reference voltage mode, as shown in brackets in FIG. 4, however, is a function of the leakage currents. The precharge mode and the reference voltage mode are then cyclically repeated to maintain the reference voltage $V_o$ at the desired valid voltage level. The values of the pulse widths for the preferred embodiment of the invention are given below in Table 1 along with the preferred values for the discrete components.

I1=4 uA
I2=108 uA
C1=3 pF
C2=0.5 pF
T1=50 nSec
T2=100 nSec
T3=65 uSec
$V_o$=1.24 V

Table 1. The component values and pulse widths for the preferred embodiment of the invention.

Having described and illustrated the principles of the invention in a preferred embodiment thereof, it should be apparent that the invention can be modified in arrangement and detail without departing from such principles. For example, the single transistor 18 can be replaced by any PN junction such as a diode. I claim all modifications and variation coming within the spirit and scope of the following claims.

We claim:

1. A switching bandgap reference voltage circuit comprising:

a PN junction:

an amplifier having an inverting input, a non-inverting input and an output:

a first current source connected between a second common voltage source and the PN junction to bias the PN junction to a first bias point during a precharge mode;

a second current source coupled between the second common voltage source and the PN junction to bias the PN junction to a second bias point during a reference voltage mode;

a first capacitor coupled between a first common voltage source and the inverting input of the amplifier during both the precharge mode and the reference voltage mode;

a second capacitor coupled between the amplifier inverting input and the amplifier output;

a first switch connected in parallel with the second capacitor; and a second switch interposed between the second current source and the PN junction.

2. A switching bandgap reference voltage circuit comprising:

an amplifier having an inverting input, a noninverting input, and an output;

a first capacitor having a first capacitance ($C_1$) and being coupled between the amplifier inverting input and a first common voltage source:

a second capacitor having a second capacitance ($C_2$) and being coupled between the amplifier inverting input and the amplifier output;

a transistor having a base, a collector, and an emitter, the base and collector being coupled to the first common voltage source, and the emitter being coupled to the amplifier noninverting input;

a first current source coupled to the transistor to provide a first current to the transistor, wherein a first voltage ($V_{BE1}$) is produced across the transistor base and emitter junction during a precharge mode;

a second current source coupled to the transistor to provide a second current to the transistor during a reference voltage mode, wherein a second voltage ($V_{BE2}$) is produced across the transistor base and the emitter junction during the reference voltage mode; and a first switch connected in parallel with the second capacitor; and a second switch interposed between the second current source and the transistor emitter, wherein the second switch is opened during the precharge mode so that only the first current is provided to the transistor ,and closed during the reference voltage mode so that the current provided to the transistor is equal to the sum of the first and second currents;

the first switch being opened during the precharge mode and closed during the reference voltage mode wherein a bandgap reference voltage ($V_o$) is produced at the amplifier output during the reference voltage mode equal to:

$$V_o = V_{BE2} + (C_2/C_1) \times (V_{BE2} - V_{BE1}).$$

3. A switching bandgap reference voltage circuit according to claim 2 wherein said first switch includes a first pass transistor having a base for receiving a first control signal, wherein the first pass transistor forms a closed circuit when the first control signal is in a first state and an open circuit when the first control signal is in a second state.

4. A switching bandgap reference voltage circuit according to claim 3 wherein said second switch includes a second pass transistor having a base for receiving a second control signal, wherein the second pass transistor forms a closed circuit when the second control signal is in a first state and an open circuit when the second control signal is in a second state.

5. A switching bandgap reference voltage circuit according to claim 4 wherein said first and second control signals are nonoverlapping control signals.

6. A switching bandgap reference voltage circuit according to claim 2 wherein said amplifier is an operational amplifier.

7. A switching bandgap reference voltage circuit according to claim 2 wherein said transistor is a PNP bipolar junction transistor.

8. A method of generating a bandgap reference voltage comprising:

supplying a first current to a PN junction during a precharge mode wherein a first voltage ($V_{BE1}$) is produced across the transistor base and emitter, wherein the step of supplying a first current includes the steps of:

coupling a first current source to the PN junction; and generating a first current in the first current source, the first current being supplied to the PN junction and the concomitant first voltage ($V_{BE1}$) is produced across the PN junction;

impressing the first voltage ($V_{BE1}$) across a first capacitor (C1);

amplifying the first voltage ($V_{BE1}$) impressed across a first capacitor with an amplifier to produce and output voltage at the amplifier output PN junction equal to the first voltage ($V_{BE1}$);

supplying a second current to the PN junction during a reference voltage mode wherein a second voltage ($V_{BE2}$) is produced across the PN junction base and emitter junction, wherein the step of supplying a second current includes the steps of:

coupling a second current source to the PN junction;

generating a second current in the second current source;

interposing a second switch between the second current source and the PN junction; and opening the second switch during the precharge mode wherein none of the second current is supplied to the PN junction; and closing the second switch during the reference voltage mode so that the current supplied to PN junction during the reference voltage mode is equal to sum of the first and second currents and the concomitant second voltage ($V_{BE2}$) is produced across the PN junction:

impressing the second voltage ($V_{BE2}$) across the first capacitor;

coupling a second capacitor having a capacitance (C2) between the first capacitor and the amplifier output during the reference voltage mode, said step of coupling the second capacitor including the steps of:

coupling the second capacitor between the first capacitor and the amplifier output;

coupling a first switch across the second capacitor;

closing the first switch during the precharge mode; and opening the first switch during the reference voltage mode; and amplifying the second voltage ($V_{BE2}$) impressed across a first capacitor with the amplifier during the reference voltage mode wherein a bandgap reference voltage ($V_o$) is produced at the amplifier output during the reference voltage mode equal to:

$$V_o = V_{BE2} + (C_2/C_1) \times (V_{BE2} - V_{BE1}).$$

9. A method of generating a bandgap reference voltage according to claim 8 wherein said steps of closing the second switch and opening the first switch include:

closing second switch during the precharge mode; and opening the first switch during the reference voltage mode simultaneously with closing the second switch during the precharge mode.

10. A method of generating a bandgap reference voltage according to claim 8 further including the step of repeatively sequencing between the precharge mode and the reference voltage mode so as to maintain the bandgap reference voltage $V_o$ at a substantially constant voltage level.

* * * * *

UNITED STATES PATENT AND TRADEMARK OFFICE
CERTIFICATE OF CORRECTION

PATENT NO. : 5,563,504
DATED : October 8, 1996
INVENTOR(S) : Gilbert et al.

It is certified that error appears in the above-identified patent and that said Letters Patent is hereby corrected as shown below:

Column 1, lines 57-58, "(I1 and I2)" should read --($I_1$ and $I_2$)--;
Column 1, line 62, "clocks 1 (Φ1) and 3 (Φ 3)" should read --clocks 1 ($\Phi_1$) and 3 ($\Phi_3$)--;
Column 1, line 63, "clock 2 (Φ2)" should read --clock 2 ($\Phi_2$)--;
Column 1, line 66, "clock 2 (Φ2)" should read --clock 2 ($\Phi_2$)--;
Column 1, line 67, "clocks 1 (Φ1) and 3 (Φ3)" should read --clock 1 ($\Phi_1$) and 3 ($\Phi_3$)--;
Column 5, line 53, "a PN junction:" should read --a PN junction;--;
Column 5, line 55, "input and an output:" should read --input and an output;--;
Column 6, line 13, "first common voltage source:" should read --first common voltage source;--.

Signed and Sealed this

Twenty-seventh Day of June, 2000

Attest:

Q. TODD DICKINSON

*Attesting Officer* *Director of Patents and Trademarks*